United States Patent
Jakobsson et al.

(10) Patent No.: US 8,405,434 B2
(45) Date of Patent: Mar. 26, 2013

(54) SYSTEM AND METHOD FOR CALIBRATING OUTPUT FREQUENCY IN PHASE LOCKED LOOP

(75) Inventors: Anders Jakobsson, Kista (SE); Christian Grewing, Kista (SE); Anders Emericks, Kista (SE); Ola Pettersson, Kista (SE); Bingxin Li, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 35 days.

(21) Appl. No.: 13/213,579

(22) Filed: Aug. 19, 2011

(65) Prior Publication Data

US 2011/0298507 A1    Dec. 8, 2011

Related U.S. Application Data

(63) Continuation of application No. PCT/CN2010/072730, filed on May 13, 2010.

(51) Int. Cl.
*H03L 7/06* (2006.01)
(52) U.S. Cl. ........................ 327/156; 327/147
(58) Field of Classification Search .............. 327/147, 327/156
See application file for complete search history.

(56) References Cited

U.S. PATENT DOCUMENTS

| | | | |
|---|---|---|---|
| 6,320,435 B1 | 11/2001 | Tanimoto | |
| 7,545,222 B2* | 6/2009 | Chou et al. | 331/1 A |
| 7,558,357 B1* | 7/2009 | Greshishchev et al. | 375/371 |
| 7,795,937 B2* | 9/2010 | Smith et al. | 327/158 |
| 8,171,335 B2* | 5/2012 | Tsai | 713/503 |
| 8,198,929 B2* | 6/2012 | Pellerano et al. | 327/158 |
| 2004/0063410 A1* | 4/2004 | Pugel | 455/191.1 |
| 2004/0119514 A1 | 6/2004 | Karlquist | |
| 2005/0105661 A1 | 5/2005 | Miller et al. | |
| 2007/0159263 A1* | 7/2007 | Chou et al. | 331/16 |
| 2009/0201065 A1 | 8/2009 | Kuwano et al. | |
| 2009/0243679 A1* | 10/2009 | Smith et al. | 327/158 |
| 2010/0156485 A1* | 6/2010 | Madoglio et al. | 327/158 |
| 2011/0298507 A1* | 12/2011 | Jakobsson et al. | 327/156 |
| 2012/0049907 A1* | 3/2012 | Da Dalt et al. | 327/147 |
| 2012/0249195 A1* | 10/2012 | Guo et al. | 327/156 |
| 2012/0280730 A1* | 11/2012 | Obkircher et al. | 327/157 |

FOREIGN PATENT DOCUMENTS

| | | |
|---|---|---|
| CN | 1293489 A | 5/2001 |
| CN | 1883119 A | 12/2006 |
| CN | 101505149 A | 8/2009 |
| WO | WO 2011/140713 A1 | 11/2011 |

OTHER PUBLICATIONS

International Search Report for International Application No. PCT/CN2010/072730, mailed Feb. 10, 2011, Huawei Technologies Co., LTD.

* cited by examiner

*Primary Examiner* — Adam Houston
(74) *Attorney, Agent, or Firm* — Staas & Halsey, LLP

(57) ABSTRACT

A Digital Calibration System for a Phase Locked Loop includes a Tuning Voltage Controller configured to set the tuning voltage to a value; a Phase Difference Quantizer configured to output a phase difference after comparing a phase of the reference signal with a phase of the feedback signal; a Digital Controller configured to receive the phase difference of the PDQ and control a coarse tuning signal such that an average phase difference of the PDQ is 0; and a Frequency Calibration Logic configured to calibrate the feedback signal in response to the output of the DC.

12 Claims, 9 Drawing Sheets

SYSTEM AND METHOD FOR CALIBRATING OUTPUT FREQUENCY IN PHASE LOCKED LOOP

CROSS-REFERENCE TO RELATED APPLICATION

This application is a continuation of International Application No. PCT/CN2010/072730, filed on May 13, 2010, which is hereby incorporated by reference in its entirety.

FIELD OF THE INVENTION

The present invention relates to a frequency generation field and especially relates to a method and apparatus for measuring and calibrating the frequency of a Phase Locked Loop (PLL).

BACKGROUND

Many electronic devices use a Phase Locked Loop (PLL) to generate or recover clock signal, generate carrier signals for radio transmission etc. The background of the invention is given with reference to the PLL 10 in FIG. 1. A conventional PLL block structure is showed. A VCO (voltage-controlled oscillator) 103 generates an output signal of frequency $f_0$. The frequency $f_0$ depends on a tuning voltage $V_T$, a digital coarse tuning word CT (Coarse Tuning) and a natural frequency of the VCO 103 according to formula 1, where $f_N$ is the natural frequency, $K_{CT}$ is the coarse tuning gain and $K_V$ is the tuning voltage gain.

$$f_0 = f_N + K_{CT} \cdot CT + K_V \cdot V_T \quad \text{formula 1}$$

The frequency f0 is divided by a division ratio N using a Divider 101. The frequency of the divider output may be denoted $f_{div}$. The divider 101 output signal, which is a square wave signal, is compared with a reference clock by a PLL controller 102. The reference clock frequency may be denoted $f_{ref}$. The PLL controller 102 determines if $f_0$ needs to be increased or decreased, and VT is adjusted accordingly. In steady state, the output frequency f0 is given by formula 2.

$$f_0 = N \cdot f_{ref} \text{(steady state)} \quad \text{formula 2}$$

$V_T$ has a limited range and can therefore only be used to adjust the output frequency to a certain extent. If $f_N$, $K_{CT}$ or $K_V$ are unknown or vary, the tuning voltage may exceed its range. If a wide range of output frequencies (wide range of N) is desired, the tuning voltage may also exceed its range.

The coarse tuning signal CT is first used to roughly calibrate the output frequency. This usually needs to be done by an automatic calibration system that should be both accurate and fast.

SUMMARY

To improve the speed of the calibration system, a method and system for calibrating a PLL is provided.

In an embodiment, the present invention provides a Digital Calibration System (DCS) for a Phase Locked Loop (PLL), wherein the PLL comprise a PLL controller used to output a tuning voltage in response to a reference signal and a feedback signal, and a voltage controlled oscillator (VCO) used to output the feedback signal as an output signal in response to the tuning voltage, the tuning voltage is used to determine if frequency of the output signal needs to be increased or decreased; comprising:

a Tuning Voltage Controller (TVC) configured to set the tuning voltage to a value;

a Phase Difference Quantizer (PDQ) configured to output a phase difference after comparing a phase of the reference signal with a phase of the feedback signal; and a Digital Controller (DC) configured to receive the phase difference of the PDQ and output a coarse tuning signal to adjust the feedback signal such that an average phase difference of the PDQ is 0.

In an embodiment, the present invention further provides a method for calibrating the output frequency in a PLL, wherein the PLL comprise a PLL controller used to output a tuning voltage in response to a reference signal and a feedback signal, a voltage controlled oscillator (VCO) used to output the feedback signal as an output signal in response to the tuning voltage, the tuning voltage is used to determine if frequency of the output signal needs to be increased or decreased, comprising:

setting the VCO tuning voltage to a value;

quantizing the phase difference between a reference signal and a feedback signal;

setting a coarse tuning to adjust the feedback signal in response to the phase difference such that an average of the phase difference is 0.

The method and system for calibrating a PLL system according to the present invention has been shown to have a high accuracy and is fast enough to be used.

BRIEF DESCRIPTION OF THE DRAWINGS

To illustrate the technical solution according to the embodiments of the present invention or in the prior art more clearly, the accompanying drawings required for describing the embodiments or the prior art are introduced below briefly. Apparently, the accompanying drawings in the following descriptions merely show some of the embodiments of the present invention, and persons of ordinary skill in the art can obtain other drawings according to the accompanying drawings without creative efforts.

DETAILED DESCRIPTION OF EMBODIMENTS

The technical solution of the present invention will be clearly and fully described below with reference to the accompanying drawings. It is obvious that the embodiments to be described are only a part rather than all of the embodiments of the present invention. All other embodiments derived by persons skilled in the art based on the embodiments of the present invention without creative efforts should fall within the protection scope of the present invention.

Figure 1:
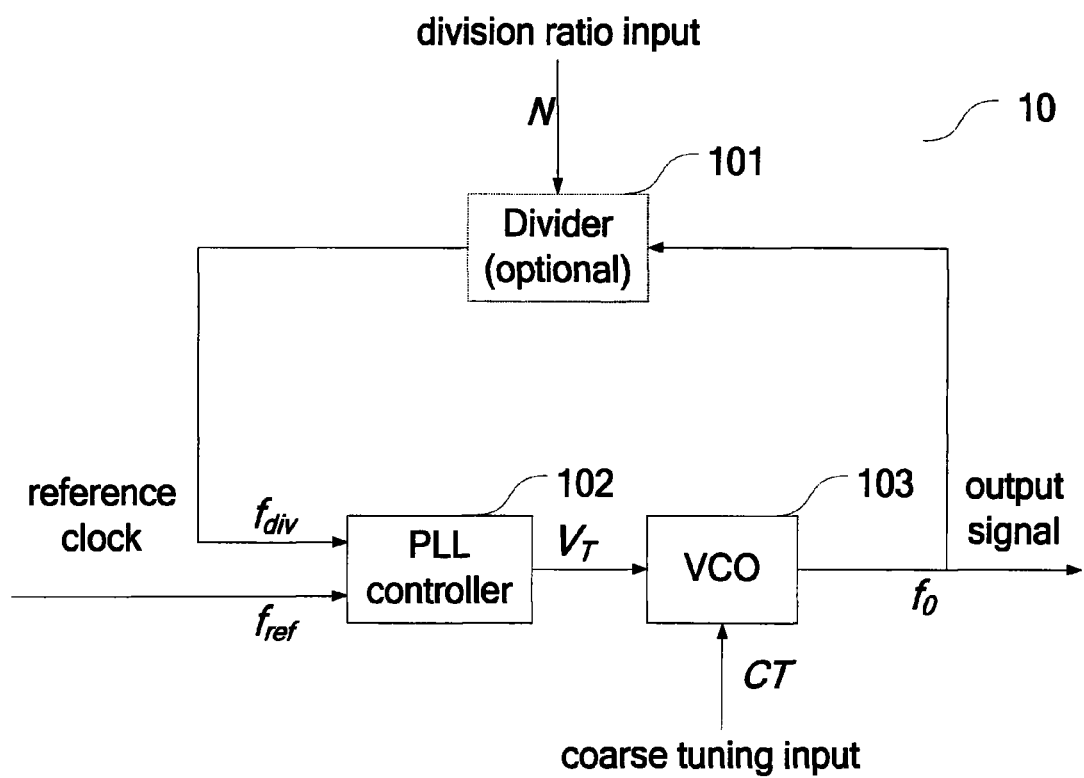
FIG. 1 is a schematic structural view of a PLL block in the prior art.
Figure 2:
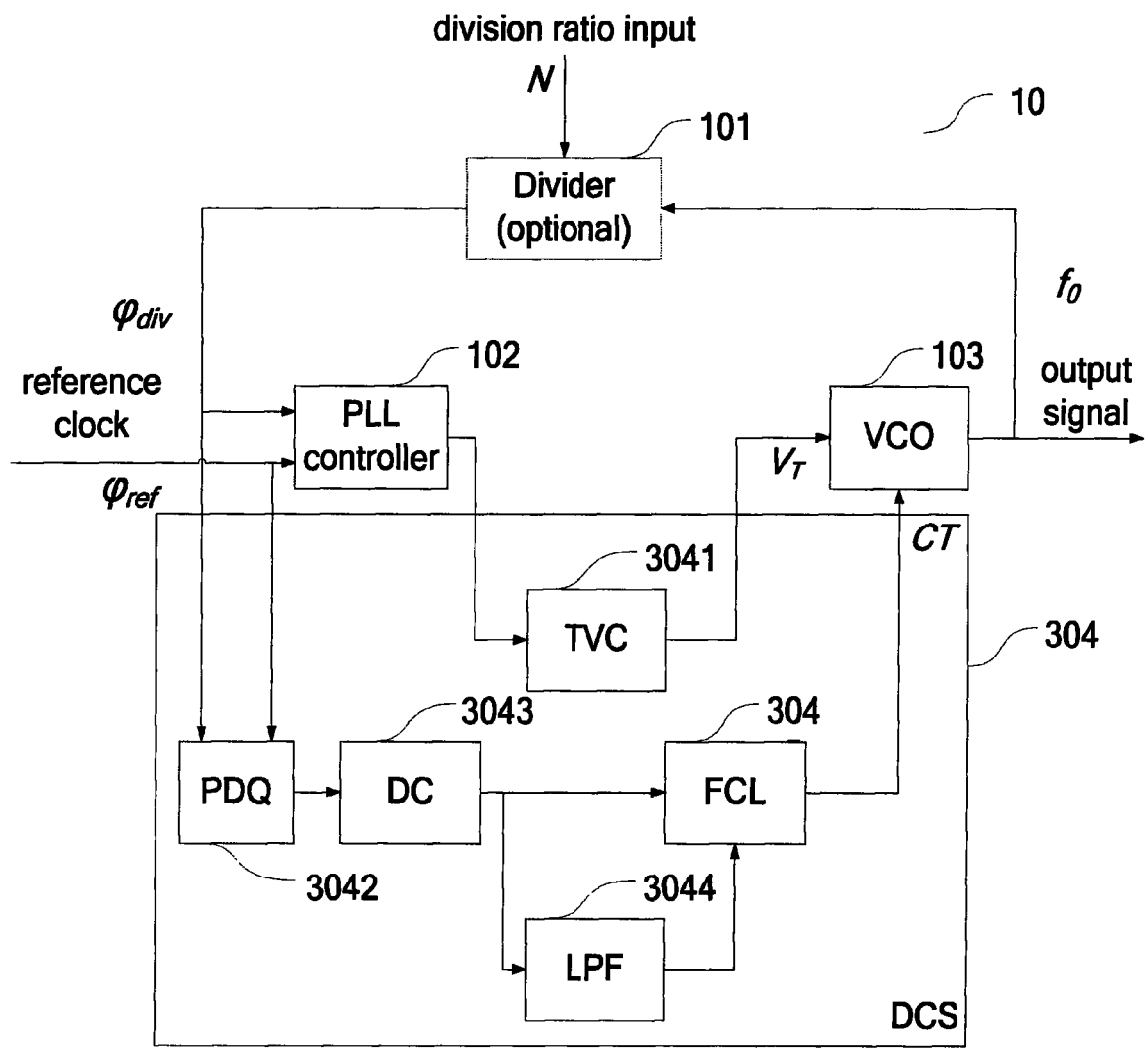
FIG. 2 is a schematic structural view of a PLL block in one embodiment.

In an embodiment of the present invention, as shown in FIG. 2, a Digital Calibration System (DCS) 304 for measuring and calibrating the frequency of a Phase Locked Loop (PLL) 10 is disclosed. The PLL 10 comprises a PLL controller 102 outputting a tuning voltage in response to a reference signal (such as a reference clock) and a feedback signal (such as an output signal, or the output signal divided by a factor N), a voltage controlled oscillator (VCO) 103 for outputting the feedback signal as an output signal in response to the tuning voltage, the tuning voltage is used to determine whether the frequency of the output signal needs to be increased or decreased. The DCS 304 includes:

a Tuning Voltage Controller (TVC) 3041 configured to set the tuning voltage to a value; The TVC may be implemented using a reference voltage source or a feedback system that controls a charge-pump;

a Phase Difference Quantizer (PDQ) 3042 configured to output a phase difference after comparing a phase of the reference signal with a phase of the feedback signal; and a Digital Controller (DC) 3043 configured to receive the phase difference of the PDQ 3042 and output a coarse tuning signal to adjust the feedback signal such that an average phase difference of the PDQ 3042 is 0.

According to the embodiment of the present invention, because of calibrating by the DCS 304, the calibration system can be made fast.

Further more, the PLL 10 further comprises a divider 101. The feedback signal is sent by a divider 101. The divider 101 is configured to divide the VCO output phase by a divider value N which is a natural number, the phase of the feedback signal is divided by the factor N before sending to the PLL controller 102.

Further more, the DC is a Proportional Integral Derivative (PID) controller.

Further more, the PDQ is configured to output 0 if the phase of the reference signal is substantially equal to the phase of the feedback signal; configured to output negative 1 if the phase of the feedback signal leads the phase of the reference signal; and configured to output positive 1 if the phase of the feedback signal lags the phase of the reference signal. The average phase difference of the PDQ 3042 is a sum of the 0, negative 1, and positive 1 in a certain time.

In detailed description in FIG. 2, the PLL controller 102 can be paralleled with a fully Digital Calibration System (DCS) 304. The TVC 3041 sets the tuning voltage VT to a preferred value. The TVC 3041 may be implemented using a reference voltage source or a feedback system that controls a charge-pump. The PDQ 3042 quantizes the phase difference $\phi_{ref}-\phi_{div}$ with three levels: positive (+1), negative (−1) or zero. The PDQ 3042 may be implemented using a D-latch. The DC 3043 is configured to control the Coarse Tuning (CT) input of the VCO 103 such that the average PDQ 3042 output is zero. Because of the quantized input the DC output will not converge to a specific value but instead converge on a limit cycle. The DC 3043 uses the PDQ output to control the coarse tuning value CT while the tuning voltage is kept at a preferred nominal level. The DC 3043 may be implemented as a digital Proportional/Integral/Derivative (PID) controller. When using such a highly quantized signal to control CT, the resulting error will not approach zero, but approach a limit cycle. The LPF 3044 filters the DC output thereby finding the midpoint of the limit cycle. In this application, the midpoint is the correct CT value. The LPF 3044 is configured to low-pass filter the DC output to obtain the midpoint of the DC output limit cycle. The filter 3044 is implemented using standard digital filter design techniques. The FCL 3045 controls the different blocks of the DCS. It may be implemented as a digital state machine or in software through a CPU. The FCL 3045 is configured to calibrate the feedback signal in response to the output of the DC, control the other blocks and acts as a data switch for the CT signal. During calibration, the FCL 3045 passes the DC output to the CT input of the VCO 103. When calibration is finished, the FCL 3045 latches the LPF 3044 value to the VCO 103 CT input. This CT value is used until the PLL 10 is calibrated again. The control signals from and to the FCL 3045 are not shown in the drawing. The coarse tuning input of the VCO 103 acts as a digital-to-analog converter. It converts a digital input code to a change in frequency. Non-idealities in this digital-to-analog conversion is included in the loop and will therefore not influence the accuracy of calibration, as long as the non-idealities does not change after the calibration is performed. The advantage of the embodiment of the present invention is that the calibration system can be made appreciably fast. It is a further advantage that the calibration system is digital, thereby being well defined. It is a further advantage that the calibration system is easily programmable.

The DCS 304 further comprises a digital Low Pass Filter (LPF) 3044. The LPF 3044 is configured to low-pass filter the DC output, the FCL is further configured to pass either the DC output or the LPF output to the VCO 103 as the coarse tuning signal to calibrate the feedback signal. The DC 3043 is configured to offset the divider value N by a value dN such that the average PDQ output is 0. The DCS 304 further comprises a digital Low Pass Filter (LPF), wherein the LPF is further configured to low-pass filter the DC output, the FCL is further configured to store the low-pass filtered DC output as the dN and output the coarse tuning signal to the divider.

Further more, the DCS 304 further comprises a digital Low Pass Filter (LPF). The LPF is further configured to low-pass filter the DC output, the FCL is further configured to store the low-pass filtered DC output as a dN1 and dN2 in different fixed time during which the PLL is substantially stabilized, the divider is further configured to divide the VCO output phase according to the difference between dN1 and dN2.

Further more, the PLL controller further comprises a Phase-Frequency Detector (PFD), a Charge-Pump (CP), and a loop filter. The PFD is configured to output an up-pulse or a down-pulse according to a phase difference or a frequency difference between the reference signal and the feedback signal, wherein the PFD outputs the up-pulse when the difference is positive, the PFD outputs the down pulse when the difference is negative.

Figure 3:
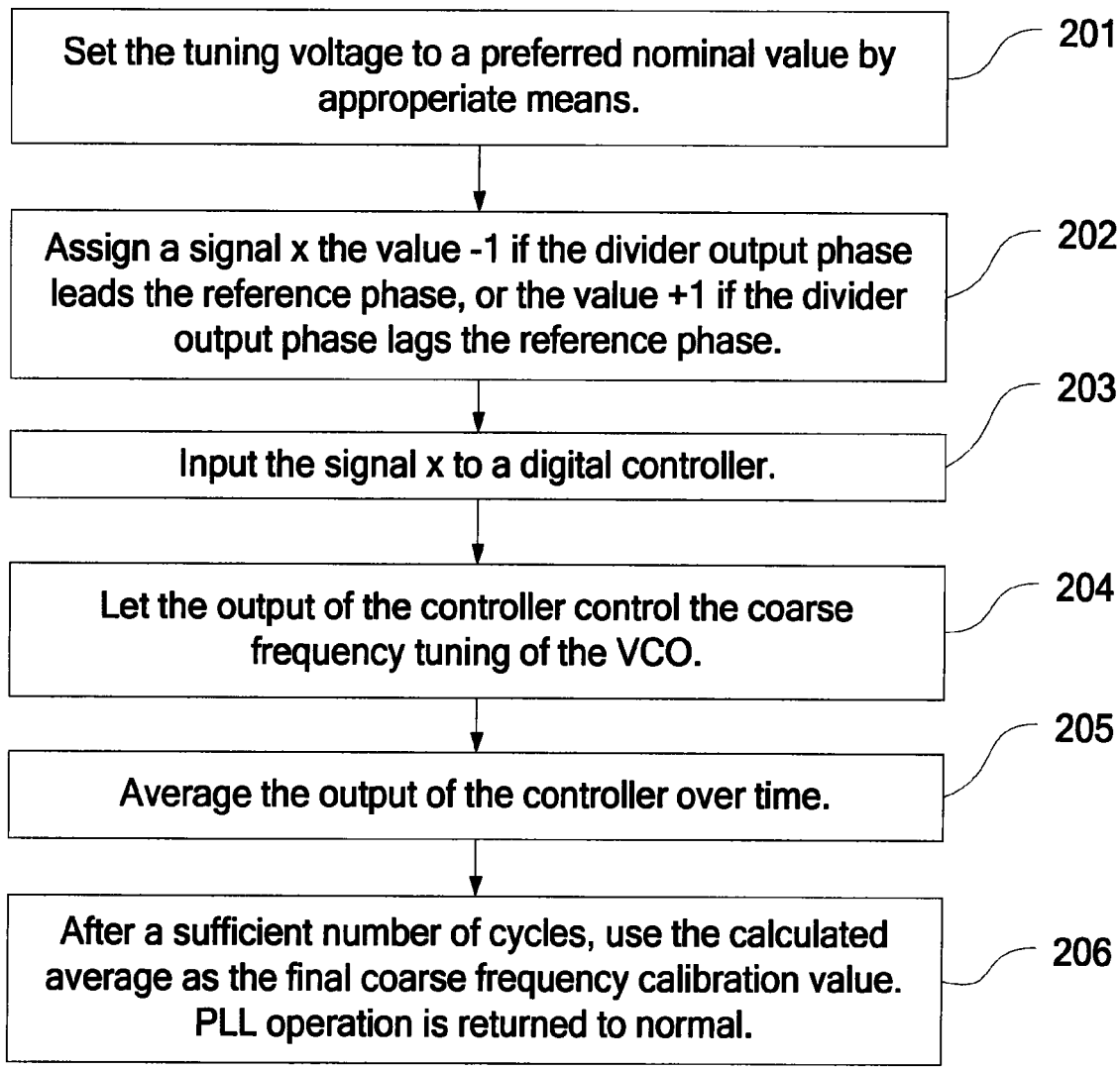
FIG. 3 is a flow chart of a general method for frequency calibration according to one embodiment.

In FIG. 3, an embodiment of the present invention describes the general method for frequency calibration with reference to FIG. 2.

Block 201: Set the tuning voltage VT of the VCO to a preferred value by appropriate means. This is usually the midpoint between ground and the supply voltage. This may be achieved by switching in a reference voltage, including the tuning voltage in a control loop or by some other method.

Block 202: Determine if the divider 101 output phase leads or lags the reference phase. A variable x is assigned the value −1 if the divider output phase leads the reference phase or the value +1 if the divider output phase lags the reference phase. If the phases difference is zero, x may be assigned either −1, 0 or +1.

Block 203: The signal x is used by a Digital Controller (DC). The controller may be of any suitable type, for example a Proportional/Integral/Derivative (PID) controller.

Block 204: The output of the control plant is used to control the coarse tuning CT of the VCO 103.

Block 205: Since the phase difference signal x is highly quantized the calibration error will never approach zero but oscillate around the correct final value. Therefore the output or any suitable internal signal of the controller is low pass filtered.

Block 206: After a time Tc the calibration system sets the coarse tuning value to the low pass filtered value from Block 205. Tc may be a fixed time during which the calibration system is assumed to stabilize or determined dynamically by inspecting the digital controller output for long term stability.

Figure 4:
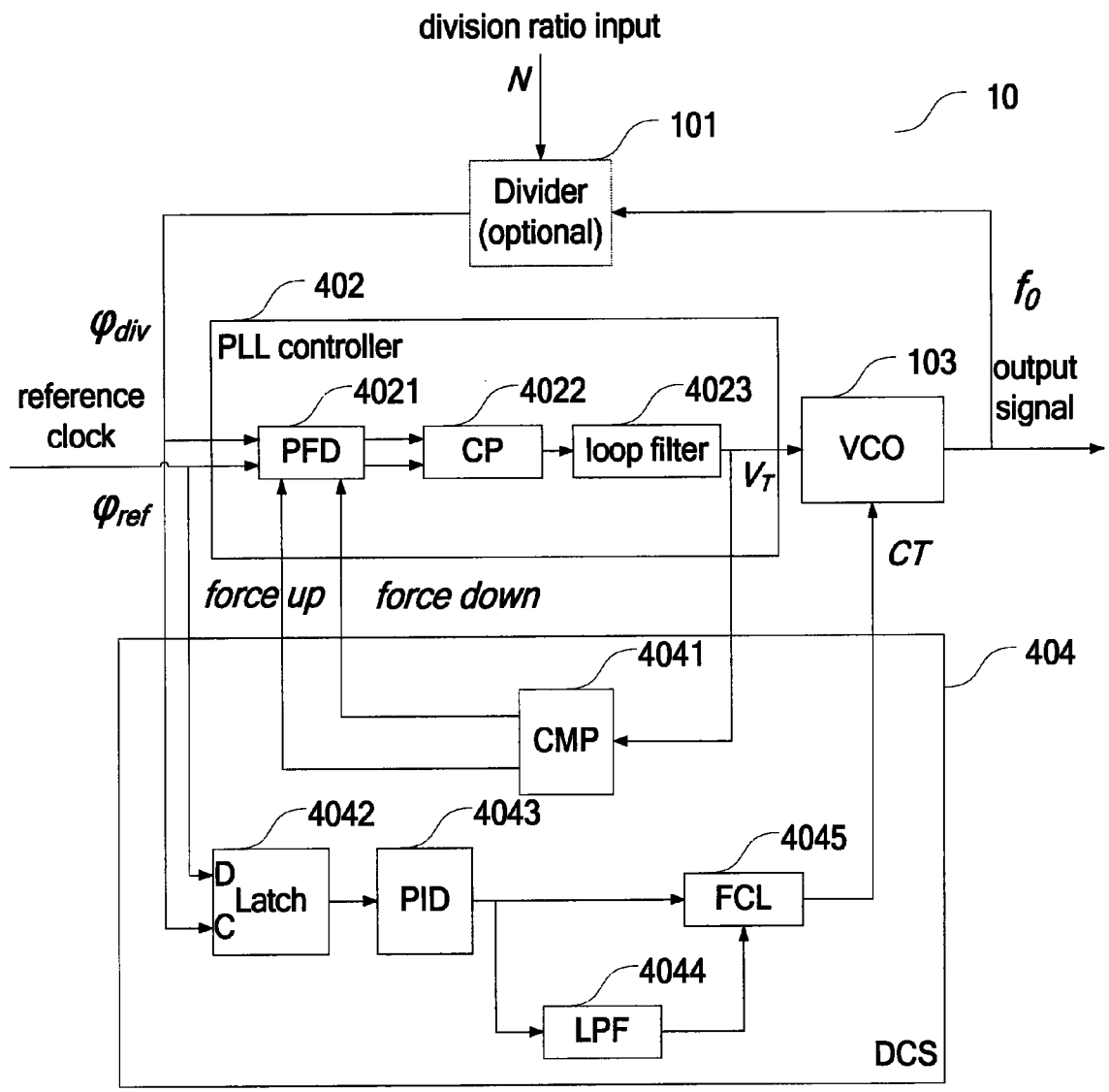
FIG. 4 is a detailed schematic structural view of a PLL block in an embodiment.

As shown in FIG. 4, another embodiment of the invention is disclosed. The PLL controller 402 comprises a Phase-Frequency Detector (PFD) 4021, a Charge-Pump (CP) 4022 and a loop filter 4023. The PFD 4021 outputs an up- or down-pulse whose length is proportional to the phase difference $\phi_{ref}-\phi_{div}$. If the phase difference is positive, PFD 4021 outputs an up-pulse. If the phase difference is negative, it outputs a down pulse. The PFD 4021 has a force up/down input that forces a high level in the up/down output respectively while the other is low. The CP 4022 pumps current into or out of the loop filter 4023. The absolute value of the current may be denoted ICP. The CP 4022 output may be configured to be high ohmic, so that no current flows in or out of it. The loop filter 4023 integrates and filters the CP 4022 output current and outputs the tuning voltage VT to the VCO 103. The Digital Calibration System (DCS) 404 comprising an inverter 4041, a latch 4042, a Proportional/Integral/Derivative (PID) controller 4043, a digital Low-Pass Filter (LPF) 4045 and Frequency Calibration Logic (FCL) 4045.

Figure 5:
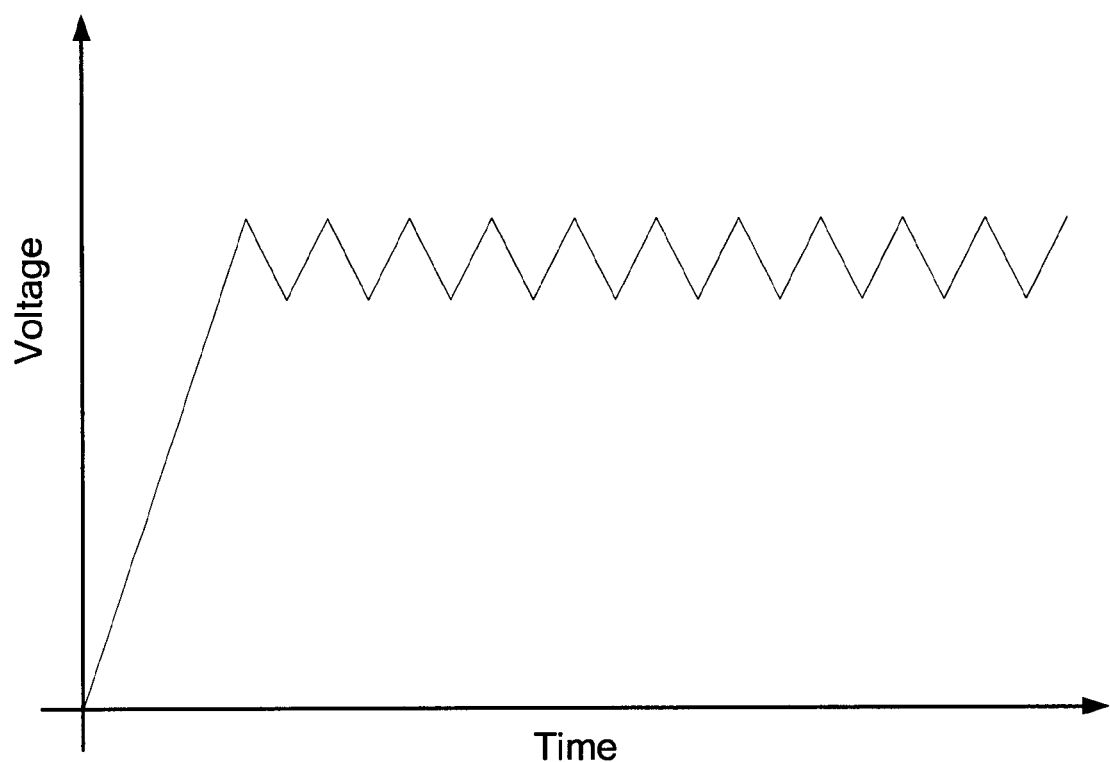
FIG. 5 is the principal view of tuning voltage oscillation due to inverter feedback in an embodiment of the present invention.

The CMP 4041 threshold voltage is assumed to be the preferred tuning voltage. When VT is below the threshold voltage, the CMP 4041 forces the PFD 4021 up. If VT is above the threshold voltage, the CMP 4041 forces the PFD 4021 down. After some time, this results in an oscillation of VT around the threshold voltage as shown in FIG. 5. At this point the CP 4022 output is made high ohmic so that VT remains approximately equal to the threshold voltage. The latch 4042 uses the divider output to latch the reference clock and outputs a 1-bit signed digit. If $\phi_{div}$ leads $\phi_{ref}$ the latch 4042 outputs −1. If $\phi_{div}$ lags $\phi_{ref}$ the latch 4042 outputs +1. The PID 4043 amplifies the input, the integral of the input and the derivative of the input with a proportional, integral and derivative gain respectively. The output signal is the sum of the three. The integral part corresponds to the frequency error and the proportional part to the phase error. The derivative part may be used to speed up the control system. It is sufficient to output only the integral part to the LPF 4044 since it is the frequency error we wish to compensate for (this configuration is not shown in the drawing). Because of the quantized input the PID 4043 output will not converge to a specific value but instead converge on a limit cycle. The LPF 4044 is configured to low-pass filter the DC output to obtain the midpoint of the DC output limit cycle. The filter may be implemented as a simple moving average filter.

The FCL 4045 is configured to control the other blocks and acts as a data switch for the CT signal. During calibration, it passes the DC output to the CT input of the VCO 103. When calibration is finished, it latches the LPF 4044 value to the VCO 103 CT input. This CT value is used until the PLL 10 is calibrated again. The control signals from and to the FCL 4045 are not shown in the drawing. The coarse tuning input of the VCO 103 acts as a digital-to-analog converter. It converts a digital input code to a change in frequency. Non-idealities in this digital-to-analog conversion is included in the loop and will therefore not influence the accuracy of calibration, as long as the non-idealities does not change after the calibration is performed.

Figure 6:
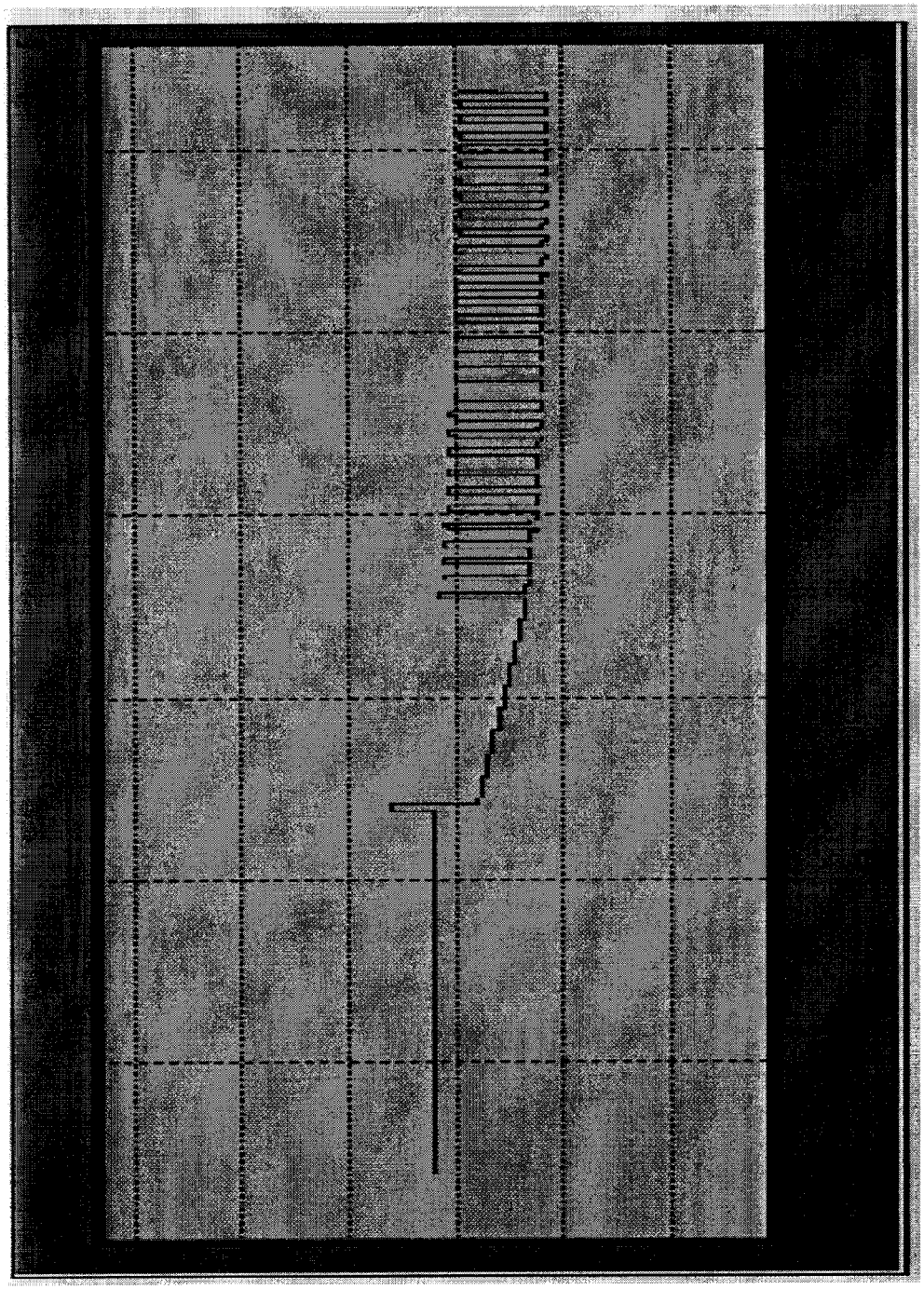
FIG. 6 is a simulation showing the coarse tuning setting according to an embodiment of the present invention.

Multiple simulations have been carried out to test the invention, and the idea has been used in a product test chip. FIG. 5 shows the principal view of tuning voltage oscillation due to inverter feedback. FIG. 6 shows the coarse tuning setting during such a simulation for a VCO with a 7-bit coarse tuning. During the first 12 μs, the VCO tuning voltage is set to its nominal value. Thereafter the PI is engaged. Not shown in the simulation is the final averaged value used for the coarse tuning setting. The system simulated has been shown to have an accuracy that to any normal extent is limited by the accuracy of the VCO coarse tuning setting, in other words, sufficient.

The present invention may be used in all cases where calibration of a VCO output frequency is desired. Instead of, or in conjunction with low pass filtering the digital controller output, the Phase Difference Quantizer (PDQ) may have a dead zone. The dead zone is designed such that small differences in phase produce an output of 0. Since the phase difference accumulates, it will eventually give rise to a non-zero output on the PDQ, but if this time span is large enough, the error may be determined small enough and the calibration may complete.

Figure 7:
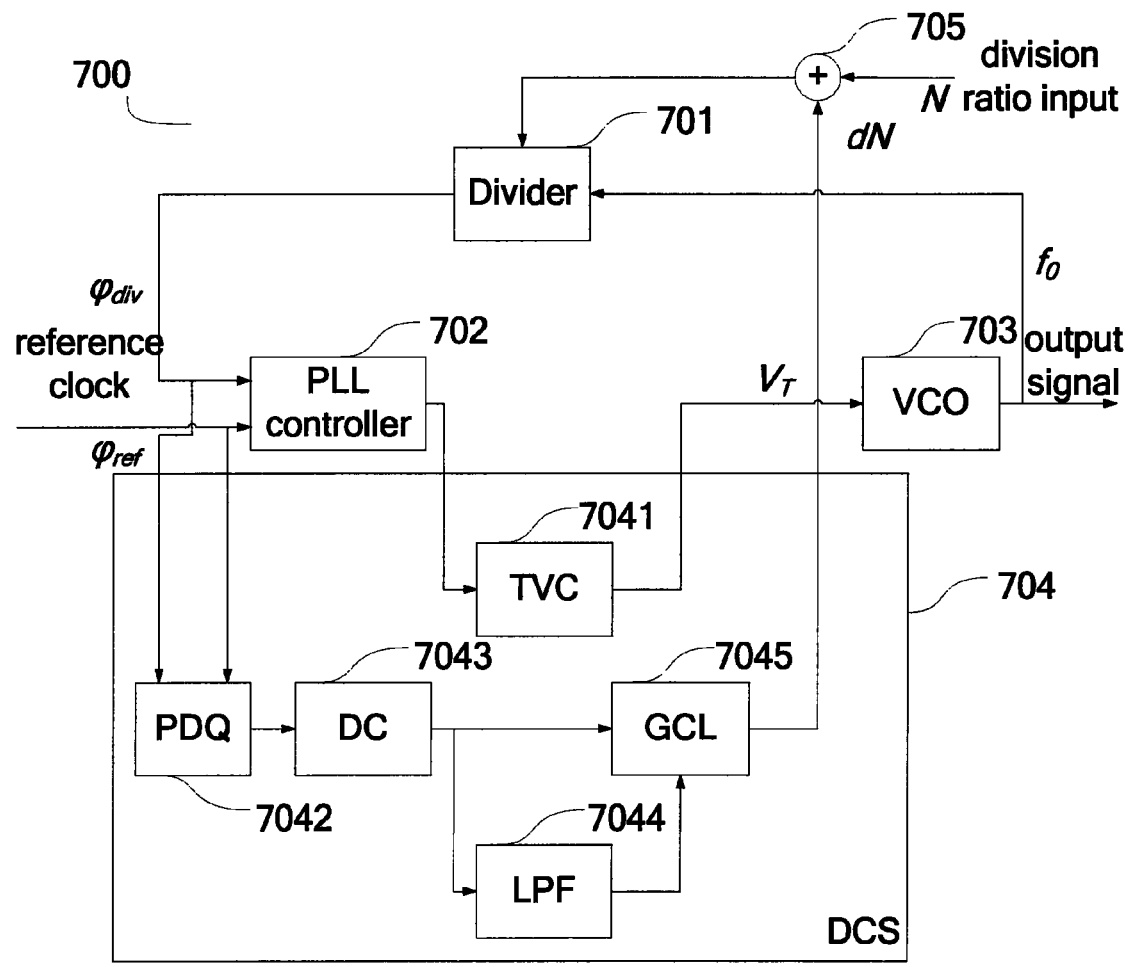
FIG. 7 is a schematic structural view of a PLL block in another embodiment.

In another embodiment of the present invention, as shown in FIG. 7, an PLL controller 702 can be paralleled with a fully Digital Calibration System (DCS) 704. The Frequency Calibration Logic (FCL) 3045 in FIG. 2 can be replaced as a Gain Calibration Logic (GCL) 7045. So, the DCS 704 comprises a Tuning Voltage Controller (TVC) 7041, a Phase Difference Quantizer (PDQ) 7042, a Digital Controller (DC) 7043, a digital Low-Pass Filter (LPF) 7044, and the Gain Calibration Logic (GCL) 7045.

The TVC 7041 may be implemented using a reference voltage source or a feedback system that controls a charge-pump. During normal PLL operation the TVC 7041 passes the tuning voltage VT to the VCO 703. During calibration, the TVC 7041 sets VT to a preferred nominal value.

The PDQ 7042 quantizes the phase difference $\phi_{ref}-\phi_{div}$ with only three levels: +1, 0 and −1. The PDQ 7042 may be implemented using a D-latch.

The DC 7043 uses the PDQ output to offset the divider value N while the tuning voltage is kept at a preferred nominal level. The divider value offset may be denoted dN such that the average PDQ 7042 output is zero. The DC 7043 may be implemented as a digital Proportional/Integral/Derivative (PID) controller. When using such a highly quantized signal, dN will not converge to a fixed value but a limit cycle.

The LPF 7044 is configured to low-pass filter the DC output thereby finding the midpoint of the limit cycle. The filter 7044 is implemented using standard digital filter design techniques.

This midpoint is stored by the GCL 7045 and the PLL 700 is forced to increase its output frequency f0 by a step, such that the size of the step is determined by the gain G. The step may be introduced by letting the charge-pump pump current during a few reference clock cycles. After the step is introduced, the DC 7044 will settle on a new limit cycle, and the midpoint of this limit cycle is stored by the GCL 7045.

The GCL 7045 controls the different blocks of the DCS 704. It may be implemented as a digital state machine or in software through a CPU. The GCL 7045 calculates how the gain should be calibrated by comparing the difference in limit cycle midpoints to a reference value. Such as, the GCL 7045 is configured to store the low-pass filtered DC output as dN1 and dN2 according to the general method, and calculate the gain calibration value. The PLL controller 702 must implement a way of altering the gain. The advantage of this embodiment of the present invention is that the calibration system can be made appreciably fast. The calibration system is digital, thereby being well defined. the calibration system is easily programmable.

Figure 8:
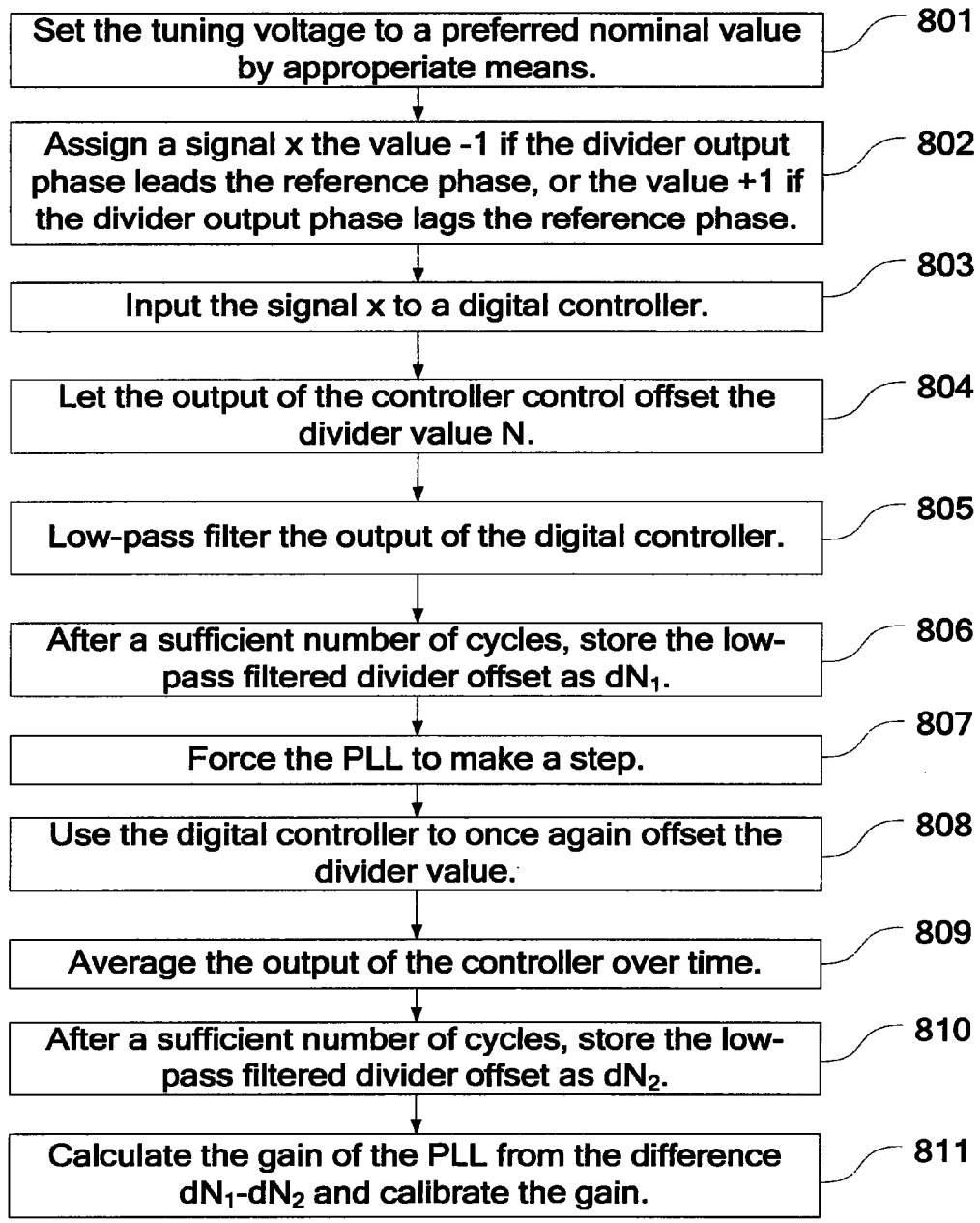
FIG. 8 is a flow chart of a general method for frequency calibration according to another embodiment of the present invention.

This section describes the general method of the gain calibration with reference to FIG. 8.

Block 801: Set the tuning voltage VT of the VCO to a preferred value by appropriate means. This is usually the midpoint between ground and the supply voltage. This may be achieved by switching in a reference voltage, including the tuning voltage in a control loop or by some other method.

Block 802: Determine if the divider 101 output phase leads or lags the reference phase. A variable x is assigned the value −1 if the divider output phase leads the reference phase or the value +1 if the divider output phase lags the reference phase. If the phases difference is zero, x may be assigned either −1, 0 or +1.

Block 803: The signal x is input to a Digital controller (DC). The controller may be of any suitable type, for example a Proportional/Integral/Derivative (PID) controller.

Block 804: The DC output is used to offset the divider value N by a value dN.

Block 805: Since the phase difference signal x is highly quantized, the calibration error will never approach zero but oscillate around the correct final value. Therefore the output or any suitable internal signal of the controller is low-pass filtered.

Block 806: After a time Tc1, the low-pass filtered value is stored as dN1. Tc1 may be a fixed time during which the system is assumed to stabilize or determined dynamically by inspecting the controller output for long term stability.

Block 807: The PLL is forced to increase its output frequency f0 by a step, such that the size of the step is determined by the gain G.

Block 808: The digital controller is once again used to offset the divider value N.

Block 809: The output or any suitable internal signal of the controller is low-pass filtered.

Block 810: After a time Tc2, the low-pass filtered signal is stored as dN2. The value of Tc2 is determined in a similar way as Tc1.

Block 811: The gain of the PLL is calculated from the difference dN1−dN2. The ideal difference can be calculated from the design. The difference between the ideal and measured difference is used to calibrate the gain. The exact method for calibrating the gain depends on the implementation. An example is given for the specific implementation.

Figure 9:
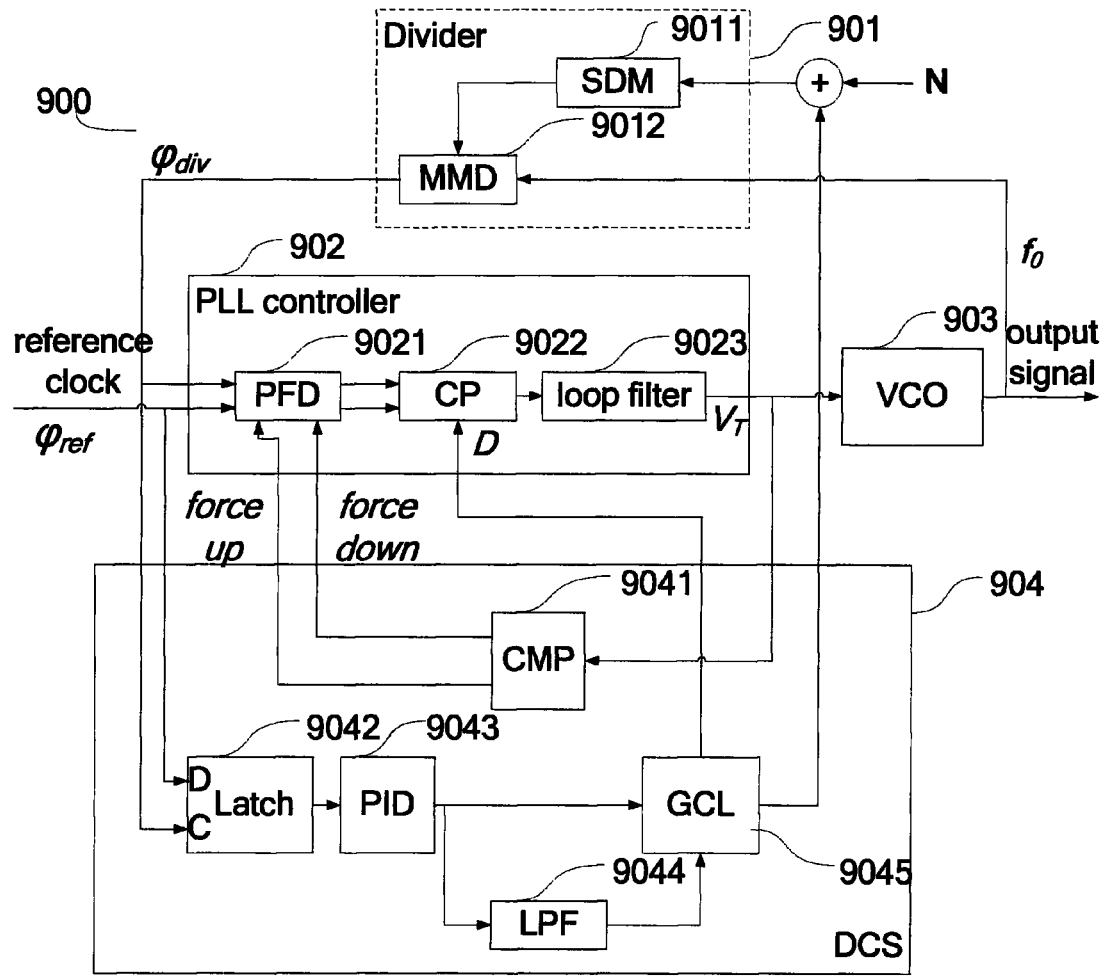
FIG. 9 is a detailed schematic structural view of a PLL block in an embodiment of the present invention.

As shown in FIG. 9, one specific embodiment of the apparatus for calibrating the PLL gain is now described. The Divider 901 comprises a Sigma-Delta Modulator (SDM) 9011 and a Multi-Modulus Divider (MMD) 9012. The PLL controller 902 comprises a Phase-Frequency Detector (PFD) 9021, a Charge-Pump (CP) 9022 and a loop filter 9023.

The PFD 9021 outputs an up- or down-pulse whose length is proportional to the phase difference $\phi_{ref}-\phi_{div}$. If the phase difference is positive, the PFD 9021 outputs an up-pulse. If the phase difference is negative, it outputs a down pulse. The PFD 9021 has force up/down inputs that forces a high level on the up/down output respectively while the other is low.

The CP 9022 pumps current into the loop filter 9023. The current may be negative (current pumped out of the filter) and its absolute value may be set by a control signal D. The absolute value of the current may be denoted $I_{CP}$ and is described by the formula 3, where D is the decimal value of the binary word $d_0, d_1, d_2 \ldots, d_{N-1}$ and $I_{LSB}$ is the LSB current step. The CP 9022 output may be configured to be high-ohmic, so that no current flows in or out of it.

$$I_{CP}=D \cdot I_{LSB}=(d_0+d_1 \cdot 2^1+d_2 \cdot 2^2+ \ldots +d_{N-1} \cdot 2^{N-1}) \cdot I_{LSB} \qquad \text{formula 3}$$

The loop filter 9023 integrates and filters the CP 9022 output current and outputs the tuning voltage VT to the VCO 903.

The PLL 10 is added with a Digital Calibration System (DCS) 404 which comprises a comparator (CMP) 9041, a D-latch 9042, a Proportional/Integral/Derivative (PID) controller 9043, a digital Low-Pass Filter (LPF) 9044, and a Gain Calibration Logic (GCL) 9045. The CMP 9041 threshold voltage is assumed to be the preferred tuning voltage. When VT is below the threshold voltage the CMP 9041 forces the PFD 9021 up. If VT is above the threshold voltage, the CMP 9041 forces the PFD 9021 down. After some time, this results in an oscillation of VT around the threshold voltage as shown in FIG. 10. At this point the CP 9022 output is made high ohmic, so that VT remains approximately equal to the threshold voltage. The CMP 9041 is only enabled during calibration. The latch 9042 uses the divider output to latch the reference clock and outputs a 1-bit signed digit. If $\phi_{div}$ leads $\phi_{ref}$ the latch 9042 outputs −1. If $\phi_{div}$ lags $\phi_{ref}$ the latch 9042 outputs +1. The PID 9043 amplifies the input, the integral of the input and the derivative of the input with a proportional, integral and derivative gain respectively. The output signal is the sum of the three. The integral part corresponds to the frequency error and the proportional part to the phase error. The derivative part may be used to speed up the control system. It is sufficient to output only the integral part to the LPF 9044 since it is the frequency error we wish to compensate for in this application (this configuration is not shown in the drawing). Because of the quantized input the PID output will not converge to a specific value but instead converge on a limit cycle. The LPF 9044 is configured to low-pass filter the DC output to obtain the midpoint of the DC output limit cycle. The filter may be implemented as a simple moving average filter.

The GCL 9045 is configured to control the other blocks in the DCS 904. These control signals are not shown in the drawing. The procedure for calibrating the gain will now be described in detail.

The CMP 9041 is enabled. This causes the tuning voltage to oscillate around the CMP 4041 threshold voltage as described above.

The CP 9022 output is made high-ohmic to preserve the tuning voltage near the CMP threshold voltage.

The PID 9043 is enabled and its output offsets the divider value. The PID 9043 output soon converge on a limit cycle whose midpoint corresponds to a divider value offset dN according to formula 4.

The LPF 9044 low-pass filters the PID 4043 output, obtaining the midpoint of the limit cycle.

The GCL 9045 stores the limit cycle midpoint as dN1. The GCL 9045 uses the PFD 9021 force up input to pump the loop filter 9023 with current during NP reference clock cycles. The CP 9022 output voltage range is normally limited and to avoid saturation the filter may be pumped in a "1-on-NR-off" fashion for a total of $N_R \times N_P$ reference clock cycles. This lets the potential at the different branches of the loop filter to stabilize.

Since pumping the filter causes an increased output frequency the average of the divider value offset will change. The new limit cycle midpoint is stored by the GCL 9045 as dN2.

The ideal difference in divider offset $\psi_I$ is given by formula 5 where $K_Z$ is the filter gain [V/C], $K_V$ is the VCO gain [Hz/V] and $I_{CP}$ is the charge pump current used during calibration.

The real difference in divider offset $\psi R$ may be different from the ideal because $K_Z$, $K_V$ and $I_{CP}$ may vary. By denoting real values with the subscript R, $\psi_R$ is given by formula 6, which is also what is measured.

The discrepancy between $\psi_R$ and $\psi_I$ may be compensated by altering the D-signal that controls the CP 9022 output current. By denoting the value of D used when pumping the filter as DC, and introducing a correction coefficient α, a corrected divider offset difference $\psi_C$ is expressed by formula 7. By setting formula 7 equal to formula 5, the correction coefficient can be calculated according to formula 8.

$$dN = \frac{f_0}{f_{ref}} - N \qquad \text{formula 4}$$

$$\psi_I = \frac{K_Z \cdot K_V \cdot N_P}{f_{ref}^2} \cdot I_{CP} \qquad \text{formula 5}$$

$$\psi_R = \frac{K_{Z,R} \cdot K_{V,R} \cdot N_P}{f_{ref}^2} \cdot I_{CP,R} = dN_2 - dN_1 \qquad \text{formula 6}$$

$$\psi_C = \frac{K_{Z,R} \cdot K_{V,R} \cdot N_P}{f_{ref}^2} \cdot (\alpha \cdot D_C \cdot I_{LSB,R}) = \qquad \text{formula 7}$$
$$\alpha \cdot (dN_2 - dN_1)$$

$$\alpha = \frac{\psi_I}{\psi_R} \qquad \text{formula 8}$$

Multiple simulations have been carried out to test the invention, and the idea has been used in a product test chip. The simulated system has the architecture shown in FIG. 9. The top graph shows the LPF 9023 output voltage (red) and an internal filter node (blue). The bottom graph shows the PID 9043 output. During the first 12 μs, the VCO tuning voltage is set to about 1.4 V. Thereafter the PID 9043 is engaged. After 50 μs, the tuning voltage is pumped up for 16·8 reference cycles in a 1-on-7-off fashion. Thereafter the PID 9043 once again sets the division ratio offset.

The simulated system has been shown to have an accuracy of about 2-3% and is fast enough to be used in between channel selections for GSM. This is valuable since VCO gain varies with selected channel. The present invention may be used in all cases where calibration of PLL gain is desired. Instead of, or in conjunction with low pass filtering the digital controller output, the Phase Difference Quantizer (PDQ) may have a dead zone. The dead zone is designed such that small differences in phase produce an output of 0. Since the phase difference accumulates, it will eventually give rise to a non-zero output on the PDQ, but if this time span is large enough, the error may be determined small enough and the calibration complete Finally, it should be noted that the above embodiments are merely provided for describing the technical solution of the present invention, but not intended to limit the present invention. It should be understood by persons of ordinary skill in the art that although the present invention has been described in detail with reference to the foregoing preferred embodiments, modifications or equivalent replacements can be made to the technical solution of the present invention, and such modifications or equivalent replacements do not depart from the spirit and scope of the technical solution of the present invention.

What is claimed is:

1. A Digital Calibration System (DCS) for a Phase Locked Loop (PLL), wherein the PLL comprises a PLL controller for outputting a tuning voltage in response to a reference signal and a feedback signal, and a voltage controlled oscillator (VCO) outputting the feedback signal as an output signal in response to the tuning voltage, the tuning voltage is used to determine whether the frequency of the output signal needs to be increased or decreased,
   the DCS comprising:
   a Tuning Voltage Controller (TVC) configured to set the tuning voltage to a value;
   a Phase Difference Quantizer (PDQ) configured to output a phase difference after comparing a phase of the reference signal with a phase of the feedback signal; and
   a Digital Controller (DC) configured to receive the phase difference of the PDQ and output a coarse tuning signal to adjust the feedback signal such that an average phase difference of the PDQ is 0.

2. The DCS according to claim 1, wherein the PLL further comprising a divider, wherein the divider is configured to divide the VCO output phase by a divider value N which is a natural number, the phase of the feedback signal is divided by the factor before sending to the PLL controller.

3. The DCS according to claim 1, wherein the DC is a Proportional Integral Derivative (PID) controller.

4. The DCS according to claim 3, wherein the PDQ is configured to output 0 if the phase of the reference signal is substantially equal to the phase of the feedback signal; configured to output negative 1 if the phase of the feedback signal leads the phase of the reference signal; and configured to output positive 1 if the phase of the feedback signal lags the phase of the reference signal.

5. The DCS according to claim 1, further comprising a digital Low Pass Filter (LPF), and a Frequency Calibration Logic (FCL),
   wherein the LPF is configured to low-pass filter the DC output, the FCL is configured to calibrate the feedback signal in response to the output of the DC and pass either the DC output or the LPF output to the VCO as the coarse tuning signal to calibrate the feedback signal, the FCL passes the DC output to the VCO during calibration and latches the LPF output to the VCO when calibration is finished.

6. The DCS according to claim 5, wherein the average phase difference of the PDQ is a sum of the 0, negative 1, and positive 1 in a certain time.

7. The DCS according to claim 2, wherein the DC is configured to offset the divider value N by a value dN such that the average PDQ output is 0.

8. The DCS according to claim 7, further comprising a digital Low Pass Filter (LPF), wherein the LPF is further configured to low-pass filter the DC output, the FCL is further configured to store the low-pass filtered DC output as the dN and output the coarse tuning signal to the divider.

9. The DCS according to claim 1, wherein the PLL controller further comprises a Phase-Frequency Detector (PFD), a Charge-Pump (CP), and a loop filter;
   the PFD configured to output an up-pulse or a down-pulse according to a phase difference or a frequency difference between the reference signal and the feedback signal, wherein the PFD outputs the up-pulse when the difference is positive, and outputs the down pulse when the difference is negative.

10. A method for calibrating the output frequency in a PLL, wherein the PLL comprises a PLL controller for outputting a tuning voltage in response to a reference signal and a feedback signal, a voltage controlled oscillator (VCO) for outputting the feedback signal as an output signal in response to the tuning voltage, the tuning voltage is used to determine if frequency of the output signal needs to be increased or decreased, comprising:

setting the VCO tuning voltage to a value;

quantizing the phase difference between a reference signal and a feedback signal;

setting a coarse tuning to adjust the feedback signal in response to the phase difference such that an average of the phase difference is 0.

11. The method according to claim 10, further comprising:

quantizing the phase difference $\phi1-\phi2$, where $\phi1$ is the phase of the reference signal and $\phi2$ is the phase of the feedback signal, such that the quantized signal is positive 1, 0 or negative 1, the phase of the feedback signal is a phase of the VCO output or the phase of the VCO output divided by a factor N; and setting a coarse tuning of the VCO such that an average of the phase difference is 0, if the phase of the reference signal is substantially equal to the phase of the feedback signal.

12. The method according to claim 10, further comprising:

quantizing the phase difference $\phi1-\phi2$, where $\phi1$ is the phase of the reference signal and $\phi2$ is the phase of the feedback signal, the phase of the feedback signal is the phase of the VCO output divided by a factor N, such that the quantized signal is positive 1, 0 or negative 1; and adding an offset dN to the factor N such that the average PDQ output is 0.

* * * * *